United States Patent
Kang

(10) Patent No.: US 8,729,686 B2
(45) Date of Patent: May 20, 2014

(54) SEMICONDUCTOR PACKAGE AND A METHOD FOR SELECTING A CHIP IN THE SEMICONDUCTOR PACKAGE

(75) Inventor: Tae Min Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 42 days.

(21) Appl. No.: 13/311,841

(22) Filed: Dec. 6, 2011

(65) Prior Publication Data
US 2012/0139128 A1    Jun. 7, 2012

(30) Foreign Application Priority Data
Dec. 7, 2010    (KR) .................. 10-2010-0124403

(51) Int. Cl.
H01L 23/02    (2006.01)
(52) U.S. Cl.
USPC .......................................................... 257/686
(58) Field of Classification Search
USPC .................. 257/685–686, 774, 777, 773
See application file for complete search history.

(56) References Cited

U.S. PATENT DOCUMENTS 6,930,396 B2 *    8/2005    Kurita et al. .................. 257/777
7,999,367 B2 *    8/2011    Kang et al. ................... 257/686

FOREIGN PATENT DOCUMENTS

KR    1020010066902 A    7/2001
KR    1020090042173 A    4/2009

* cited by examiner

*Primary Examiner* — Hoa B Trinh
(74) *Attorney, Agent, or Firm* — William Park & Associates Patent Ltd.

(57) ABSTRACT

A semiconductor package includes a first semiconductor chip formed with a first through-silicon via; a second semiconductor chip stacked over the first semiconductor chip and formed with a second through-silicon via; and a cantilever formed over the first semiconductor chip and electrically connected to the first through-silicon via or the second through-silicon via according to an electrical signal.

18 Claims, 13 Drawing Sheets

US 8,729,686 B2

SEMICONDUCTOR PACKAGE AND A METHOD FOR SELECTING A CHIP IN THE SEMICONDUCTOR PACKAGE

CROSS-REFERENCES TO RELATED APPLICATIONS

The present application claims priority under 35 U.S.C 119(a) to Korean Application No. 10-2010-0124403, filed on Dec. 7, 2010, in the Korean Intellectual Property Office, which is incorporated herein by reference in its entirety set forth in full.

BACKGROUND

1. Field of the Invention

Exemplary embodiments of the present invention relate to a semiconductor package and a method for selecting a chip in a semiconductor package, and more particularly, to a stack package including through-silicon vias, which uses a cantilever to allow a semiconductor chip to be easily selected, and a method for selecting a chip of a stack package.

2. Description of the Related Art

Recently, as electronic products trend toward miniaturization and high performance and demand for portable mobile products increases, demand for an ultra-miniaturized semiconductor memory with large capacity has increased. In general, attempts to increase storage capacity of a semiconductor memory may be divided into a method of increasing a degree of integration of a semiconductor chip and a method of mounting a plurality of semiconductor chips in one semiconductor package. In the former case, significant effort, cost and time are required to increase the degree of integration. However, in the latter case, if it is possible to mount a plurality of semiconductor chips in one package, this may increase storage capacity of a semiconductor memory by changing only a packaging method. Also, in the latter case, a number of advantages are provided in terms of investment cost, research and development, and required time when compared to the former case. Semiconductor memory manufacturers have made efforts to increase the storage capacity of a semiconductor memory device by using a multi-chip package which is manufactured in such a manner that a plurality of semiconductor chips are mounted in one semiconductor package.

Methods for mounting a plurality of semiconductor chips in one semiconductor package are divided into horizontally mounting semiconductor chips and vertically mounting semiconductor chips. Due to the characteristics of electronic products which trend toward miniaturization, most semiconductor memory manufacturers prefer a stack type multi-chip package in which semiconductor chips are packaged in such a way as to be vertically stacked.

While a stack type multi-chip package technology provides advantages in that the manufacturing cost of a package can be reduced through a simplified process and mass production is possible, disadvantages are caused in that spaces for forming electrical connections in the package becomes insufficient due to an increase in the number and the size of chips to be stacked. Typically, a conventionally stacked multi-chip package is manufactured such that a plurality of chips are disposed in a chip region of a substrate and the bonding pads of the respective chips and the conductive circuit patterns of the substrate are electrically connected using wires. Consequently, spaces are required for wire bonding and areas are needed for the wires to connect to circuit patterns of the substrate, which may result in an increase in the size of a semiconductor package. In consideration of these facts, a package structure using through-silicon vias (TSVs) has been suggested as an example of the stack type multi-chip package. A package using through-silicon vias has a structure in which through-silicon vias are formed in the chips at a wafer level and physical and electrical connections are formed vertically between the chips using the through-silicon vias. Researches for a package adopting through-silicon vias have been conducted so as to accommodate the trend toward multi-functionality and high performance of mobile products. In the stack type multi-chip package, it is necessary to be able to select at least any one chip and apply an electrical signal to the selected chip.

FIG. 1 is a perspective view of a prior art stack package. FIG. 2 is a cross-sectional view of section A (the chip selection pad part) of FIG. 1, and FIG. 3 is a plan view of FIG. 1, showing an example of connecting chip selection pads using redistribution layers.

FIG. 1 shows a case in which semiconductor chips 20, 30, 40 and 50 are stacked on a substrate 10 and are connected with one another by means of through-silicon vias (TSVs) 24, 34, 44 and 54. A Vcc pad 12 and a Vss pad 14 are disposed on the substrate 10, and various I/O pads are disposed on the respective chips 20, 30, 40 and 50. Some of the I/O pads serve as chip selection pads 22, 32, 42 and 52 used for selecting chips. In the case where the same chips 20, 30, 40 and 50 are stacked using the through-silicon vias 24, 34, 44 and 54, since the chip selection pads 22, 32, 42 and 52 are placed at the same vertical position—that is, the pads 22, 32, 42 and 52 are stacked above each other—chip selection cannot be implemented using the through-silicon vias 24, 34, 44 and 54. Accordingly, redistribution layers 26, 36, 46 and 56 are formed on the respective chip selection pads 22, 32, 42 and 52 to be connected with through-silicon vias 28, 38, 48 and 58 which are placed at different positions. However, this method has a problem in that, since the redistribution layers 26, 36, 46 and 56 of the stacked chips 20, 30, 40 and 50 have different patterns, processing costs increase and difficulties exist in administrating processes.

FIG. 4 is a perspective view showing a prior art semiconductor package using wires for selecting a chip. Referring to FIG. 4, in the case where the same semiconductor chips 20, 30, 40 and 50 are stacked, since chip pads are positioned at the same positions on their respective chip, semiconductor chips 20, 30, 40 and 50 are stacked in a step-like shape to provide access to each pad, and chip selection pads 22, 32, 42 and 52 are connected with a Vcc pad 12 and a Vss pad 14 using wires W so as to be capable of applying chip selection signals to the semiconductor chips 20, 30, 40 and 50. Even in this stack configuration problems are caused in that wire bonding for chip selection increases the thickness of a package and the lengths of the wires W increase depending upon. The increased wire length causes signal delay and, the step-like stack configuration degrades the structural reliability of a package.

SUMMARY

Embodiments of the present disclosure relate to a semiconductor package which can select a chip through a simple method while not increasing the size of a package and obviating the need for redistribution layers, and a method for selecting a chip in a semiconductor package.

In one embodiment, a semiconductor package includes a first semiconductor chip formed with a first through-silicon via; a second semiconductor chip stacked over the first semiconductor chip and formed with a second through-silicon via; and a cantilever formed over the first semiconductor chip and electrically connected to the first through-silicon via or the second through-silicon via according to an electrical signal.

The semiconductor package may further include an electrified body formed over the first semiconductor chip at a position separated from the first through-silicon via to deform the cantilever.

The cantilever may include: a first projecting part projecting upward out of the first semiconductor chip at a position separated from the first through-silicon via; and an extending part extending horizontally from the first projecting part toward the second through-silicon via. The cantilever may further include a second projecting part projecting from the extending part toward the second through-silicon via.

The semiconductor package may further include an anchor disposed under the cantilever to fasten the cantilever to the first semiconductor chip.

The cantilever may comprises a material selected from the group consisting of gold, silver, copper, aluminum, nickel, tungsten, titanium, platinum, palladium, tin, lead, zinc, indium, cadmium, chrome and molybdenum.

The first semiconductor chip may include a chip selection wiring line to apply the electrical signal to the cantilever.

The semiconductor package may further include a switching element formed over the chip selection wiring line to control whether to deform the cantilever. The switching element may also include a transfer gate.

The semiconductor package may further include an inverter disposed on the chip selection wiring line.

The semiconductor package may further include a sealant sealing a perimeter of the cantilever. The sealant may be selected from the group consisting of epoxy resin, phenol resin, acryl resin and isocyanate resin.

The semiconductor package may further include a filler that fills an area defined by the sealant. The filler may include a liquid phase epoxy resin or a silicon oil.

The semiconductor package may further include a liquid dome protective coating on the cantilever. The liquid dome may include a liquid phase epoxy resin or a silicon oil.

The semiconductor package may further include a molding member configured to mold the first semiconductor chip and the second semiconductor chip.

The cantilever may include an extending part which extends from the position separated from the first through-silicon via toward the first through-silicon via or the second through-silicon via, the first through-silicon via may be placed below the extending part, and the semiconductor package may further include an electrified body which is placed below an end of the extending part and is used as a pull-down electrode.

The semiconductor package may further include a conductive protrusion formed over the first through-silicon via.

In another embodiment, a method for selecting one of a first and second semiconductor chip in a semiconductor package comprising a plurality of semiconductor chips, includes applying an electrical signal to a cantilever to deform the cantilever so that the cantilever electrically connects with one of a first through-silicon via comprising the first semiconductor chip or a second through-silicon via comprising the second semiconductor chip. The method may also include, forming the first through-silicon via in the first semiconductor chip and forming an electrified body over the first semiconductor chip to be separated from the first through-silicon via; forming the cantilever to be placed above the first through-silicon via; stacking the second semiconductor chip formed with a second through-silicon via such that the second through-silicon via is placed at a position corresponding to the first through-silicon via.

The forming cantilever may include forming a first projecting part at a position separated from the first through-silicon via to project out of the first semiconductor chip; and forming an extending part to extend horizontally from the first projecting part toward the second through-silicon via.

Forming the extending part may further include forming a second projecting part to project from the extending part toward the second through-silicon via.

Forming the cantilever may further include forming a sealant to seal a perimeter of the cantilever.

Applying the electrical signal may include applying the electrical signal to the electrified body.

Applying the electrical signal may include applying a binary signal to the cantilever.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present disclosure will be described with reference to accompanying drawings. However, the disclosed embodiments are for illustrative purposes only and are not intended to limit the scope of the disclosed embodiments.

Figure 1:
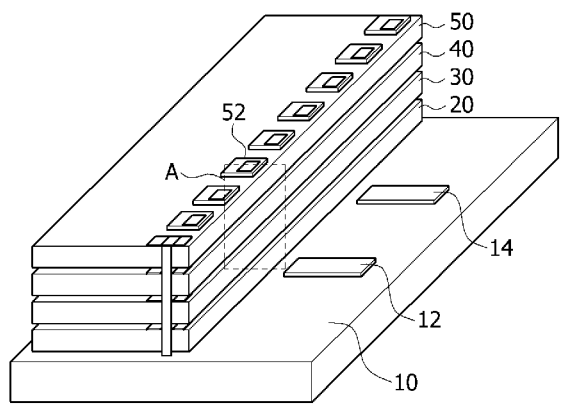
FIG. 1 is a perspective view of a prior art stack package.
Figure 2:
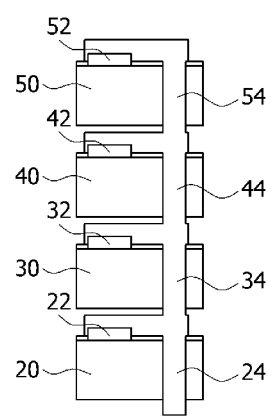
FIG. 2 is a cross-sectional view of section A (a chip selection pad part) of FIG. 1.
Figure 3:
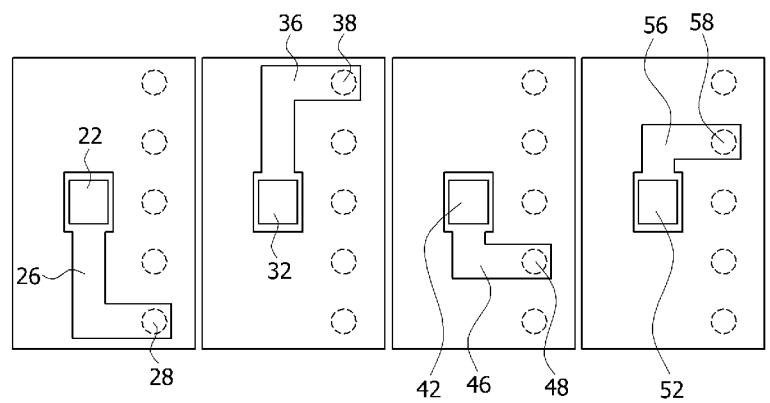
FIG. 3 is a plan view of FIG. 1 showing an example of connecting chip selection pads using redistribution layers.
Figure 4:
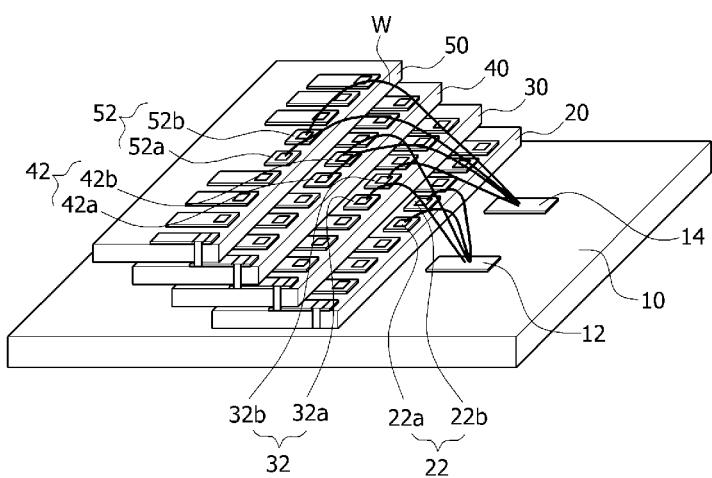
FIG. 4 is a perspective view showing a prior art semiconductor package using wires for selecting a chip.
Figure 5:
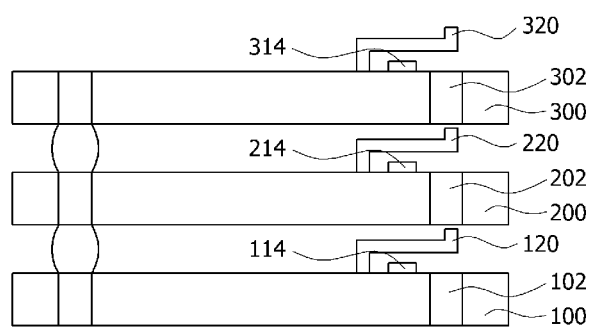
FIG. 5 is a cross-sectional view of a semiconductor package in accordance with an embodiment of the subject semiconductor package.

Referring now to FIG. 5, depicted is a cross-sectional view of a semiconductor package in accordance with an embodiment of the present disclosure. The semiconductor package in accordance with the present embodiment of the disclosure, comprises a plurality of semiconductor chips, for example, a first semiconductor chip 100, a second semiconductor chip 200 and a third semiconductor chip 300 that are sequentially stacked. The semiconductor package may also comprise a first cantilever 120, a second cantilever 220 and a third cantilever 320, which may be deformed through application of electrical signals and may perform chip selecting functions. The cantilevers 120, 220, 320 may be interposed between the respective semiconductor chips 100, 200 and 300. A first through-silicon via 102, a second through-silicon via 202 and a third through-silicon via 302 that may be used for chip selection are formed through the semiconductor chips 100, 200 and 300. A first electrified body 114, a second electrified body 214 and a third electrified body 314, which can deform the cantilevers 120, 220 and 320 through electrical interactions with the cantilevers 120, 220 and 320, may be disposed on the semiconductor chips 100, 200 and 300. Semiconductor devices such as memory devices, logic devices, optoelectronic devices or power devices may be formed in the semiconductor chips 100, 200 and 300, and various passive devices such as resistors and condensers may also be included in the semiconductor devices.

The cantilevers 120, 220 and 320 may be electrically connected with the through-silicon vias 102, 202 and 302 by electrical repulsive forces from the electrified bodies 114, 214 and 314, by which corresponding semiconductor chips 100, 200 and 300 may be selected. That is to say, configurations may be made such that, if the first cantilever 120 is deformed when it resides between the first semiconductor chip 100 and the second semiconductor chip 200, the first cantilever 120 may be connected with the through-silicon via 202 of the second semiconductor chip 200, which may result in the second semiconductor chip 200 being selected. If the second cantilever 220 placed between the second semiconductor chip 200 and the third semiconductor chip 300 is deformed such that it is connected with the through-silicon via 302 of the third semiconductor chip 300, the third semiconductor chip 300 is selected. Through-silicon vias 102, 202 and 302, may be formed using generally known methods without limiting the scope of the disclosed embodiments. For example, through-silicon vias, such as through-silicon vias 102, 202 and 302, may be formed in such a manner that grooves are defined on one surface of a silicon wafer through laser drilling or DRIE (deep reactive ion etching) and, after forming an insulation layer and a seed metal layer, a conductive substance is filled in the grooves through electroplating. Also, after a process for defining the grooves is completed, in order to remove residues produced while defining the grooves or allow a subsequent plating process to be easily performed, plating adhesibility may be improved through chemical processing or physical processing. Further, the grooves may be formed as vertical grooves or tapered grooves.

Figure 6:
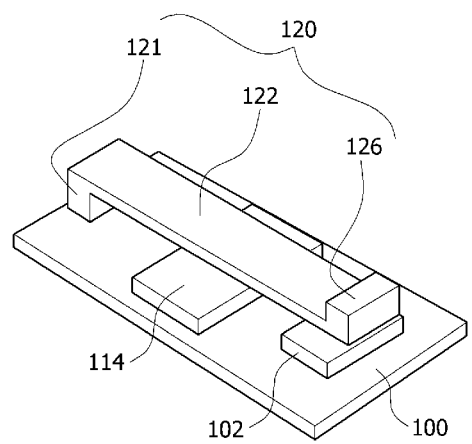
FIGS. 6 and 7 are respectively a perspective view and a front view illustrating an embodiment of a semiconductor package comprising a cantilever.
Figure 7:
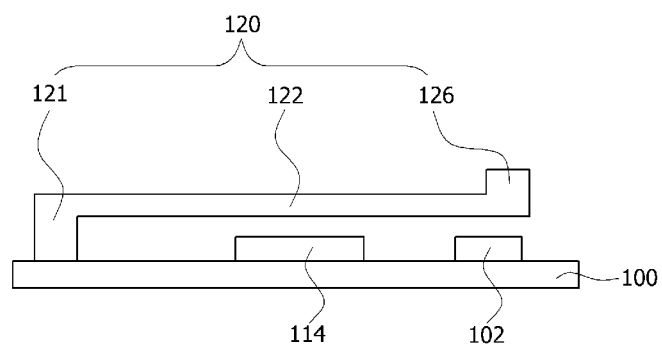

FIGS. 6 and 7 are respectively a perspective view and a front view illustrating a cantilever in accordance with an embodiment of the present disclosure. For the sake of convenience in explanation, a through-silicon via is also shown in FIGS. 6 and 7. Although the cantilever 120 formed on the first semiconductor chip 100 in FIG. 5 will be described for the sake of convenience in explanation, it may be noted that these descriptions may be applied to the other cantilevers 220 and 320 formed on the other semiconductor chips 200 and 300. The cantilever 120 may be deformed by an electrical signal and may comprise a first projecting part 121, an extending part 122 and a second projecting part 126. The first projecting part 121 may project toward the upper surface of the first semiconductor chip 100 at a position separated from the first through-silicon via 102. The extending part 122 may extend horizontally from the first projecting part 121 to the position of the first through-silicon via 102 or the second through-silicon via 202 (see FIG. 5). Further, the second projecting part 126 may project from the distal end of the extending part 122 toward the second through-silicon via 202. Formation of the second projecting part 126 may not be required.

The first projecting part 121, the extending part 122 and the second projecting part 126 may include a conductive substance, and may be formed of the same substance or different substances. For example, a single layer or multiple layers of a metallic substance comprising at least any one element selected from among, such as gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a conductive organic substance, silicon (Si), and/or a metal nitride may be used. The electrified body 114 is charged with plus (+) or minus (−) charges and may function to provide an electrical repulsive force to the cantilever 120. The electrified body 114 may be an electrified body which is momentarily charged with plus (+) or minus (−) charges or may be an electrified body which is semipermanently charged with plus (+) or minus (−) charges. For example, the electrified body 114 may be a condenser in which a high dielectric thin film substance is interposed between conductors, or may constitute a conductor so that plus (+) charges are accumulated in the electrified body 114 at the moment when plus (+) charges are accumulated in the cantilever 120. That is to say, the electrified body 114 may also be formed as a single layer or multiple layers comprising at least any one element selected among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), or may be a condenser having a structure in which a high dielectric substance is inserted into the single layer or between the multiple layers.

The above-described cantilever structure merely represents an example embodiment, and it is to be noted that the cantilever 120 may have other structures. For example, the cantilever 120 may be formed on a lower surface of the second semiconductor chip 200 (see FIG. 5), and may constitute a piezoelectric cantilever which includes a thin piezoelectric film, a top electrode formed on an upper surface of the thin piezoelectric film and a bottom electrode formed on a lower surface of the thin piezoelectric film. The piezoelectric cantilever does not need the electrified body 114, and employs a piezoelectric effect such that the piezoelectric cantilever is deformed when an electrical signal is applied to a top electrode and a bottom electrode. By controlling a direction in which the piezoelectric cantilever is deformed, the piezoelectric cantilever may be connected with any one of the first through-silicon via 102 or the second through-silicon via 202 (see FIG. 5).

FIGS. 8*a* to 8*i* are cross-sectional views showing processes for forming a cantilever in accordance with an embodiment of the present disclosure.

Figure 8A:
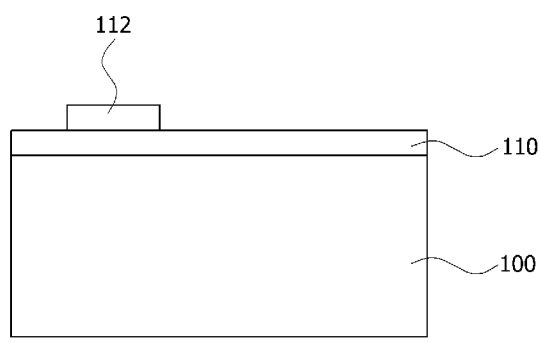
FIGS. 8a to 8i are cross-sectional views showing processes for forming the cantilever.

Referring to FIG. 8*a*, a dielectric layer 110 is formed on a semiconductor chip or a silicon wafer 100. An anchor 112 may be formed on the dielectric layer by depositing and patterning a conductive substance. The dielectric layer 110 may be constituted by an inorganic insulation substance such as a silicon oxide, a silicon nitride, a silicon oxynitride and a metal oxide or an organic insulation substance, or may be constituted by a mixture of an inorganic insulation substance and an organic insulation substance. The dielectric layer 110 may be formed as a single layer or multiple layers. For instance, the dielectric layer 110 may be formed as a dielectric layer with a double-layered structure constituted by $SiO_2$ and SiN. The dielectric layer 110 may be formed through, but not limited to, vacuum deposition, sputtering, chemical vapor deposition (CVD), spin coating, deep coating, screen printing, etc. The anchor 112 may be formed as a single layer or multiple layers including at least any one element selected among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo). In an embodiment, the anchor 112 may be a single layer or multiple layers including TiN. Since TiN has small electrical resistance of about 20 μΩcm and high Young's modulus of about 600 GPa and is invulnerable to a stress, TiN may be used as an anchor for a cantilever. Also, while not shown in a drawing, a wiring pattern for applying an electrical signal to the anchor 112 may be formed under the anchor 112, that is, on the semiconductor chip 100. While the semiconductor chip is designated by the same reference numeral 100 as the first semiconductor chip in FIG. 5, it is to be noted that the semiconductor chip may be any one of the stacked semiconductor chips depicted in the embodiments of the subject semiconductor package described herein.

Figure 8B:
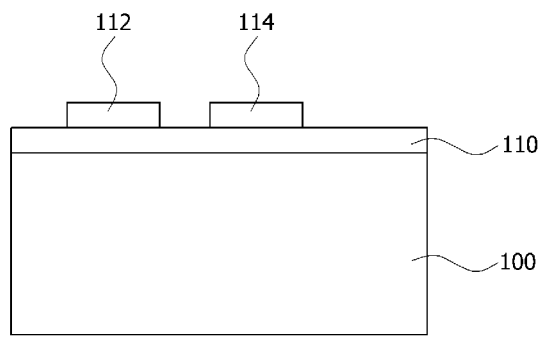

Referring to FIG. 8b, an electrified body 114 is formed. The electrified body 114 may be comprise a condenser in which a high dielectric thin film substance is interposed between conductors or may be formed of a conductive substance. A wiring pattern for applying an electrical signal to the electrified body 114 may be formed in or on the surface of the semiconductor chip 100. The electrified body 114 is formed at a position separated by a predetermined distance from a first through-silicon via (not shown) formed through the semiconductor chip 100. A process for forming the electrified body 114 may include a process for charging the electrified body 114 with plus or minus charges.

Figure 8C:
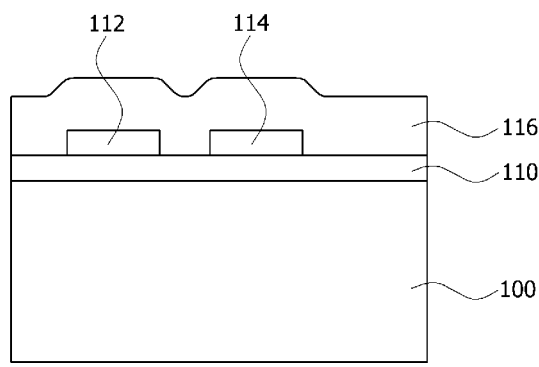

Referring to FIG. 8c, a first sacrificial layer 116 is formed.

The first sacrificial layer 116 may be formed of, but not limited to, polysilicon (poly-Si), phosphor-silicate glass (PSG), zinc oxide (ZnO) or polymer. Chemical vapor deposition (CVD) may be used if the first sacrificial layer 116 is formed of polysilicon or phosphor-silicate glass, sputtering may be used if the first sacrificial layer 116 is formed of zinc oxide, and spin coating may be used in the case where the first sacrificial layer 116 is formed of polymer.

Figure 8D:
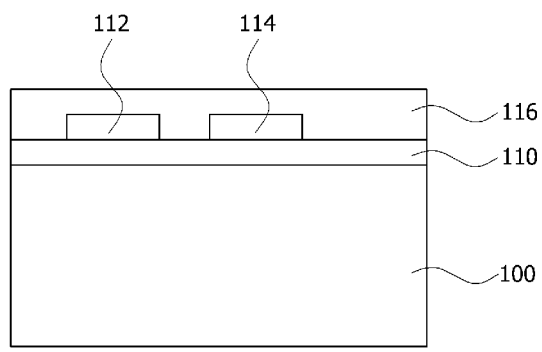

Referring to FIG. 8d, the first sacrificial layer 116 may be planarized. Planarization may be implemented through chemical mechanical polishing (CMP). In the case where the first sacrificial layer 116 is already planar or planarization is not required, the planarization process may be omitted.

Figure 8E:
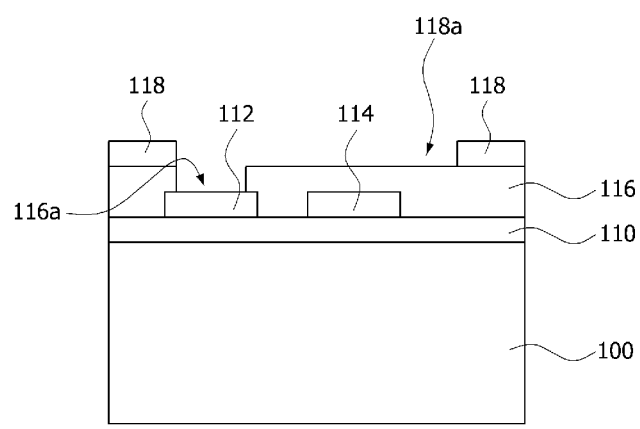

Referring to FIG. 8e, after defining an opening 116a by patterning the first sacrificial layer 116, a second sacrificial layer 118 may be formed and patterned, by which an opening 118a is defined. By forming the second sacrificial layer 118 and sequentially patterning the second sacrificial layer 118 and the first sacrificial layer 116, the openings 116a and 118a for forming a cantilever are defined. The second sacrificial layer 118 may be formed of a same or a different substance as or from the first sacrificial layer 116. For example, the second sacrificial layer 118 may be formed of polysilicon (poly-Si), phosphor-silicate glass (PSG), zinc oxide (ZnO) or polymer.

Figure 8F:
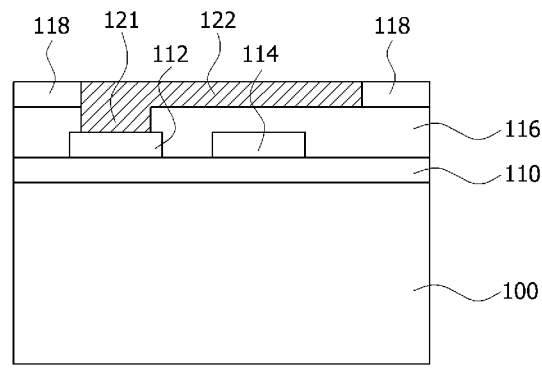

Referring to FIG. 8f, by filling a conductive substance in the opening 116a (see FIG. 8e) defined in the first sacrificial layer 116 and in the opening 118a (see FIG. 8e) defined in the second sacrificial layer 118, a first projecting part 121 and an extending part 122 are formed. The conductive substance filled in the openings 116a and 118a may be a single layer or multiple layers of a metallic substance comprising at least any one element selected among, such as gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a conductive organic substance, silicon (Si), and a metal nitride. The first projecting part 121 and the extending part 122 may be formed through vacuum deposition, sputtering, chemical vapor deposition (CVD), screen printing, electroless plating, electroplating, etc.

Figure 8G:
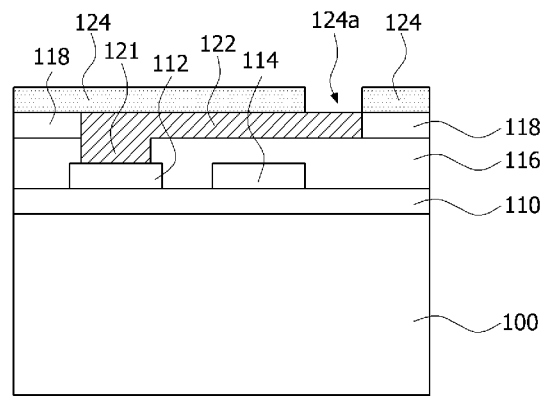

Referring to FIG. 8g, by depositing and patterning another sacrificial layer, a third sacrificial layer 124 with an opening 124a is formed. The third sacrificial layer 124 may be formed of the same or different substance as or from the first sacrificial layer 116 or the second sacrificial layer 118. For instance, the third sacrificial layer 124 may be formed of polysilicon (poly-Si), phosphor-silicate glass (PSG), zinc oxide (ZnO) or polymer.

Figure 8H:
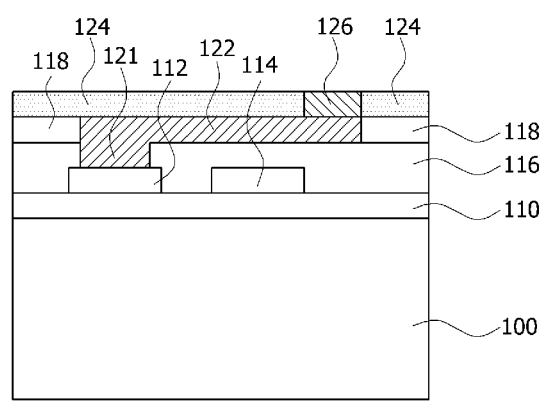

Referring to FIG. 8h, by filling a conductive substance in the opening 124a defined in the third sacrificial layer 124, a second projecting part 126 is formed. The conductive substance may be a single layer or multiple layers of a metallic substance comprising at least any one element selected among, such as gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo), a conductive organic substance, silicon (Si), and a metal nitride. The third projecting part 126 may be formed through vacuum deposition, sputtering, chemical vapor deposition (CVD), screen printing, electroless plating, electroplating, etc.

Figure 8I:
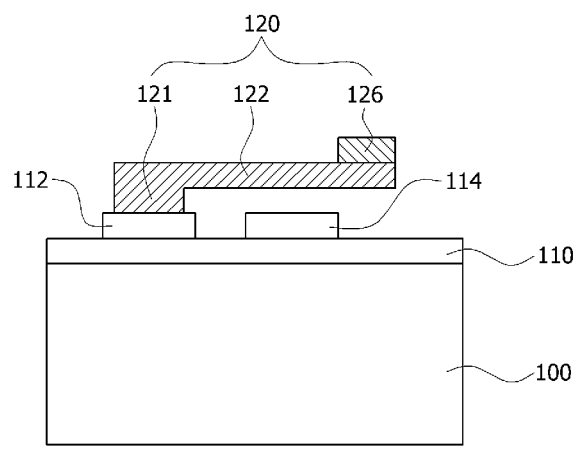

Referring to FIG. 8i, by removing the sacrificial layers 124, 118 and 116, a cantilever 120 is completely formed. In the case where the sacrificial layers 116, 118 and 124 are formed of polysilicon, the sacrificial layers 116, 118 and 124 may be removed through dry etching using $CF_4$, $C_2F_6$, $XeF_2$ or $BrF_2$. In the case where the sacrificial layers 116, 118 and 124 are formed of phosphor-silicate glass or zinc oxide, the sacrificial layers 116, 118 and 124 may be removed through BOE (buffered oxide etch) or using hydrogen fluoride (HF). In the case where the sacrificial layers 116, 118 and 124 are formed of polymer, the sacrificial layers 116, 118 and 124 may be removed through ashing or using an organic solvent such as acetone.

After the above-described processes for forming the cantilever 120 are completed, a process for forming a sealant for sealing the cantilever 120, a process for forming a liquid dome, and a process for filling a filler member inside the sealant may be performed.

Figure 9:
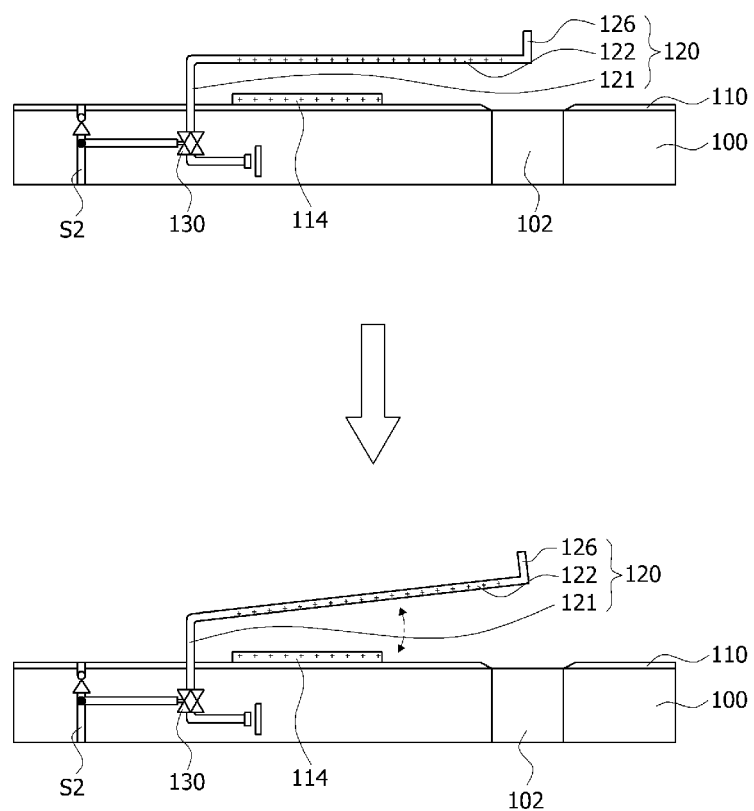
FIG. 9 is a cross-sectional view explaining an operating principle of the cantilever.

FIG. 9 is a cross-sectional view explaining the operating principle of the cantilever in accordance with an embodiment of the present disclosure. Referring to FIG. 9, if a chip selecting function is not being performed, the cantilever 120 is not in an electrified state. Although the electrified body 114 is depicted with plus (+) charges, the electrified body 114 may also be charged with minus (−) charges, or the electrified body 114 may be maintained in an uncharged state and may be charged when the cantilever 120 is charged. To this end, a wiring pattern (not shown) for applying an electrical signal to the electrified body 114 may be disposed in or on the upper surface of the semiconductor chip 100.

In order to perform a chip selecting operation, a wiring line S2 for chip selection may be disposed in and/or on an upper surface of the semiconductor chip 100, and a switching element 130 may be connected to the wiring line S2. The switching element 130 may be, for example, a transmission gate. The transmission gate may serve as a gate circuit for opening and closing transfer of a signal and transmits an on-off signal (a binary signal of 0 or 1) to the cantilever 120. For instance, if a setting is made such that the cantilever 120 and the electrified body 114 produce repulsive forces when a binary signal of 0 is applied, as the binary signal of 0 is applied, plus charges are charged in the cantilever 120, and the cantilever 120 is bent upward due to the repulsive force produced from the plus charges accumulated in the electrified body 114 and is electrically connected with the through-silicon via (not shown) of a semiconductor chip which is positioned over the semiconductor chip 100.

Figure 10:
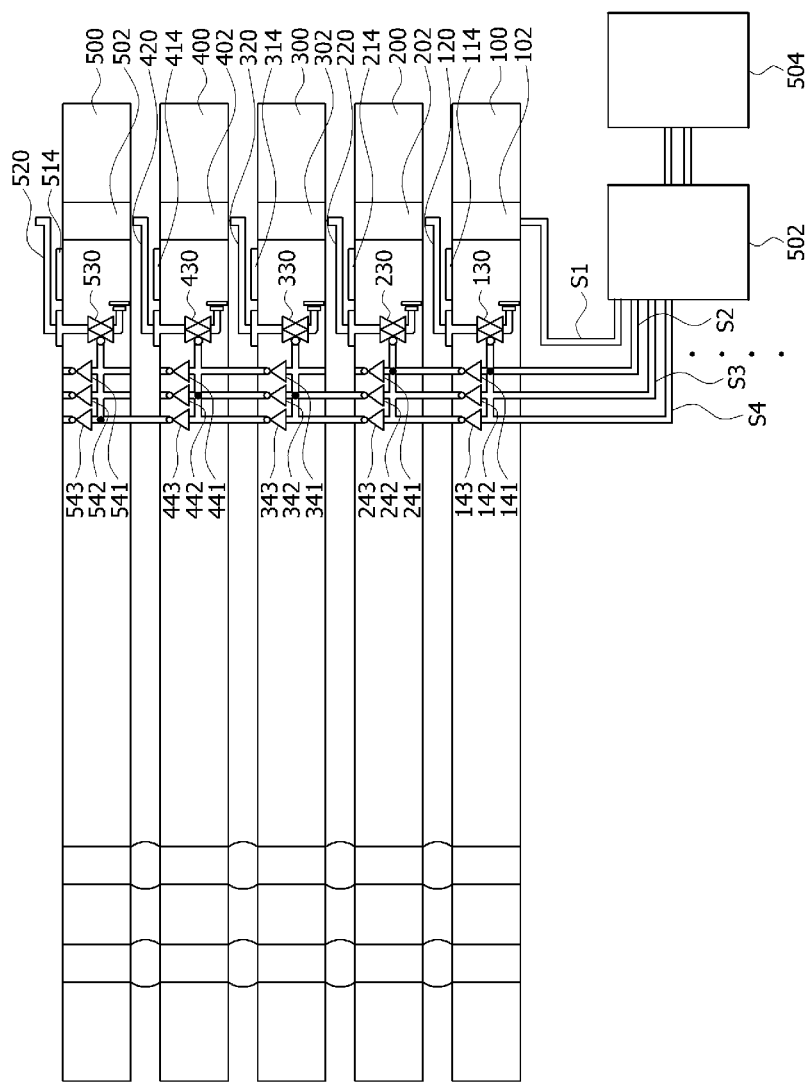
FIG. 10 is a cross-sectional view showing another embodiment of the subject semiconductor package.
Figure 11:
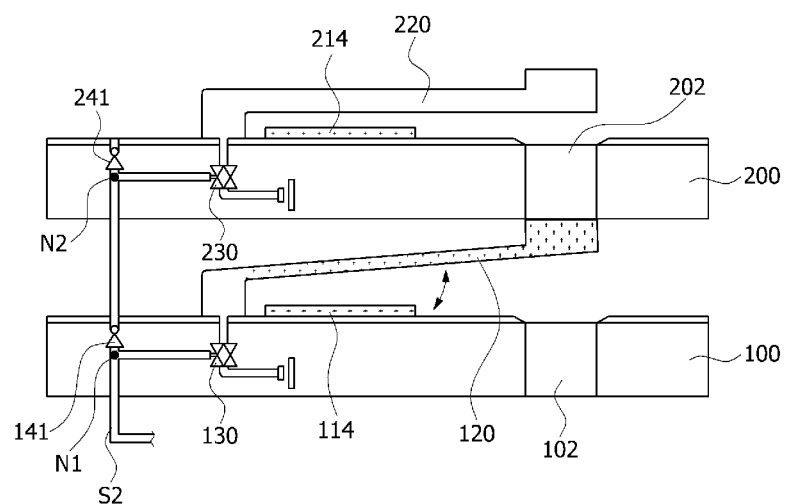
FIGS. 11 and 12 are conceptual views used in explaining a method for selecting a semiconductor chip in accordance with another embodiment of the disclosure.
Figure 12:
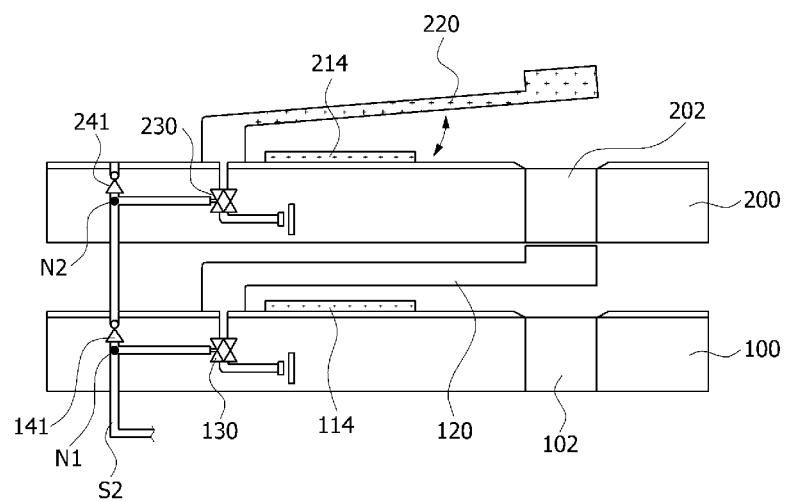

FIG. 10 is a cross-sectional view showing a semiconductor package in accordance with another embodiment of the present disclosure, and FIGS. 11 and 12 are cross-sectional views explaining a method for selecting a semiconductor chip in accordance with another embodiment of the present invention. Referring to FIG. 10, the semiconductor package in accordance with the present embodiment has a structure in which at least two semiconductor chips are stacked. FIG. 10 shows, as an example, a structure in which a first semiconductor chip 100, a second semiconductor chip 200, a third semiconductor chip 300, a fourth semiconductor chip 400 and a fifth semiconductor chip 500 are stacked. In order for chip selection, a first through-silicon via 102, a second through-silicon via 202, a third through-silicon via 302, a fourth through-silicon via 402 and a fifth through-silicon via 502 are formed in the respective semiconductor chips. A first cantilever 120 and a first electrified body 114, a second cantilever 220 and a second electrified body 214, a third cantilever 320 and a third electrified body 314, a fourth cantilever 420 and a fourth electrified body 414, and a fifth cantilever 520 and a fifth electrified body 514 are formed at positions separated from the respective through-silicon vias 102, 202, 302, 402 and 502. If the fifth semiconductor chip 500 is an uppermost semiconductor chip, the fifth cantilever 520 and the fifth electrified body 514 may be omitted.

Switching elements 130, 230, 330, 430 and 530 are formed to perform switching operations for the cantilevers 120, 220, 320, 420 and 520 which are formed on the respective semiconductor chips 100, 200, 300, 400 and 500, and chip selection wiring lines S1, S2, S3 and S4 for chip selection may be connected to an encoder 502 and a controller 504. For instance, the first chip selection wiring line S1 may be electrically connected to the first through-silicon via 102 of the first semiconductor chip 100 to select the first semiconductor chip 100, the second chip selection wiring line S2 may be electrically connected to the first cantilever 120 and the second cantilever 220 to select the second semiconductor chip 200 or the third semiconductor chip 300. The switching elements 130, 230, 330, 430 and 530 are electrically connected to the cantilevers 120, 220, 320, 420 and 520 which are formed on the respective semiconductor chips 100, 200, 300, 400 and 500. Inverters 141 and 241 may be electrically connected to the second chip selection wiring line S2, inverters 142, 242, 342 and 442 may be electrically connected to the third chip selection wiring line S3, and inverters 143, 243, 343, 443 and 543 may be electrically connected to the fourth chip selection wiring line S4. It is not necessary that the respective chip selection wiring lines S2, S3 and S4 are connected with the inverters of all the semiconductor chips 100, 200, 300, 400 and 500, and a connection scheme may be determined according to a scheme of a chip selecting operation. Also, inverters not connected to the respective chip selection wiring lines may be omitted. For instance, only the inverters 141 and 241 are electrically connected to the second chip selection wiring line S2, and the inverters 341, 441 and 541 are electrically disconnected, and therefore, corresponding inverter forming processes may be omitted. Connections between the semiconductor chips of the respective chip selection wiring lines S2, S3 and S4 may be formed using solder bumps (not shown). For instance, while the second chip selection wiring line S2 is connected to the second semiconductor chip 200 via the first semiconductor chip 100, an electrical connection between the first semiconductor chip 100 and the second semiconductor chip 200 may be formed through a solder bump (not shown). Selection of the first semiconductor chip 100 may be implemented by applying an electrical signal (a binary signal of 0 or 1) to the first chip selection wiring line S1 directly connected to the first through-silicon via 102 for selection of the first semiconductor chip 100.

Hereinbelow, an example operation of selecting the second semiconductor chip 200 will be described with reference to FIGS. 10 and 11. The chip selection method described below is an example embodiment, and it is to be noted that various methods may be used. In order to select the second semiconductor chip 200, a binary signal of 0 is applied to the second chip selection wiring line S2. In the present example embodiment, when the binary signal of 0 is applied, chip selection is implemented. The applied binary signal of 0 branches to the first switching element 130 at a first node N1 (see FIG. 11), and causes plus charging of the first cantilever 120. Setting is made such that the electrified body 114 is also kept charged with plus charges. Thus, as repulsive forces act between the first cantilever 120 and the first electrified body 114, the first cantilever 120 is deformed upward and as a result, is electrically connected with the second through-silicon via 202 for selection of the second semiconductor chip 200, by which the second semiconductor chip 200 is selected. The binary signal of 0, which passes through the inverter 141 via the first node N1, is inverted to a binary signal of 1 by the inverter 141. The binary signal of 1 branches to the second switching element 230 at a second node N2 (see FIG. 11). At this time, since the second switching element 230 is set to be turned off, the binary signal of 1 does not cause plus charging of the second cantilever 220, and thus, the second cantilever 220 does not select the third semiconductor chip 300. The signal, which passes through the inverter 241 via the second node N2, is not applied to a semiconductor chip which is placed over the second semiconductor chip 200, since the second chip selection wiring line S2 does not extend beyond the second semiconductor chip 200. However, where it is necessary to select a plurality of chips using one signal, the second chip selection wiring line S2 may extend beyond the inverter 241 and may be connected to at least one semiconductor chip which is placed over the second semiconductor chip 200.

Hereinbelow, an example operation of selecting the third semiconductor chip 300 will be described with reference to FIGS. 10 and 12. In order to select the third semiconductor chip 300, a binary signal of 1 is applied to the second chip selection wiring line S2. The applied binary signal of 1 branches to the first switching element 130 at the first node N1 (see FIG. 12). Since the binary signal of 1 is an off signal, an electrification phenomenon does not occur in the first cantilever 120. As a consequence, deformation (bending) of the first cantilever 120 does not occur, therefore the second semiconductor chip 200 is not selected. The binary signal of 1 which passes through the inverter 141 via the first node N1 is inverted to a binary signal of 0 by the inverter 141. The binary signal of 0 branches to the second switching element 230 at the second node N2 (see FIG. 12). Since the binary signal of 0 is set in such a manner that the second switching element 230 is turned on (that is, a '0' is an on signal), plus charging occurs in the second cantilever 220. Therefore, the second cantilever 220 is deformed by the repulsive force from the second electrified body 214 and is electrically connected to the third through-silicon via 302 for selection of the third semiconductor chip 300, by which the third semiconductor chip 300 is selected.

Figure 13:
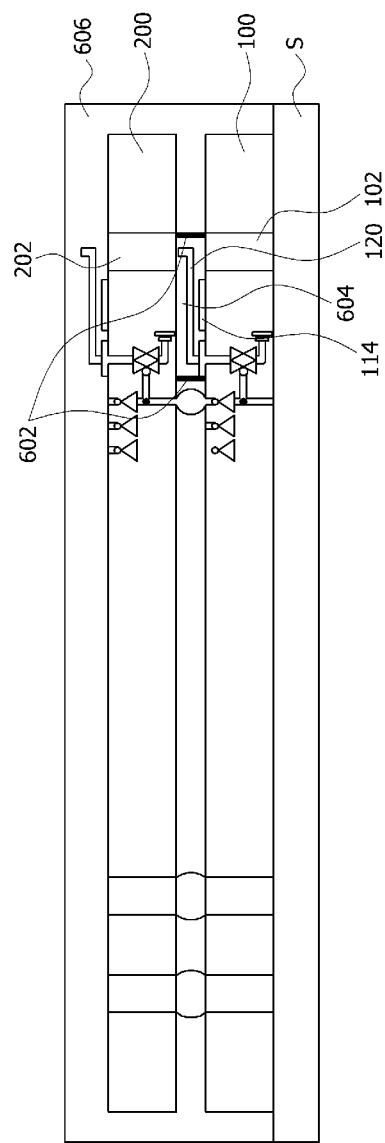
FIG. 13 is a cross-sectional view showing a semiconductor package in accordance with another embodiment of the disclosure.

FIG. 13 is a cross-sectional view showing a semiconductor package in accordance with another embodiment of the present disclosure. In the semiconductor package in accordance with the present embodiment of the disclosure, although more than two of semiconductor chips may be stacked on a substrate S, only two semiconductor chips 100 and 200 are shown in the embodiment depicted in FIG. 13. Embodiments of the subject semiconductor package and method may be applied to a wafer level chip size package (WLCSP) which does not need a molding member 606 for molding the semiconductor chips 100 and 200. If the molding member 606 such as an EMC (epoxy molding compound) is used, the molding member 606 may prevent movement of the cantilever 120. To enable, or allow for, movement of the cantilever 120, a sealant 602 may be formed around the cantilever 120 and an electrified body 114, and the inside thereof may remain as an empty space or may be filled with a filler 604. That is, the filler 604 may fill an area sealed off by or defined by the sealant 602. In another embodiment, a liquid dome may be formed through liquid encapsulation without using the sealant 602.

The sealant 602 may be dispensed using a dispenser or may be printed through screen printing. The sealant 602 may include at least any one of an inorganic sealant and an organic sealant may be used. The organic sealant may comprise a sealant including at least any one resin selected among epoxy resin, phenol resin, acryl resin and isocyanate resin. A sealant may be divided into a two-component type in which a base and a hardener may be mixed with each other, or a one-component type in which a base and a hardener exist in a combined state. Both the two-component type and the one-component type may be used. Not only a thermosetting type sealant but also an ultraviolet setting type sealant and a sealant of a combined thermosetting and ultraviolet setting type may be used. The sealant 602 may also include a filler. As the filler, both an inorganic filler and an organic filler may be used. As the inorganic filler, calcium carbonate ($CaCO_3$), magnesium carbonate ($MgCO_3$), barium sulfate, magnesium sulfate, iron oxide, titanium oxide, zinc oxide, aluminum oxide ($Al_2O_3$), aluminum silicate, silicon dioxide, potassium titanate, talc, asbestos powder, quartz powder, glass fiber, and mica may be used. As the organic filler, polymethylmethacrylate and polystyrene may be used.

As the filler 604 filled in the sealant 602, a substance containing liquid phase epoxy resin, a silicon oil, etc. may be used without a limiting sense. The liquid dome may be formed of a substance which is the same as or different from the filler 604, and may be selected according to the filler 604.

Figure 14:
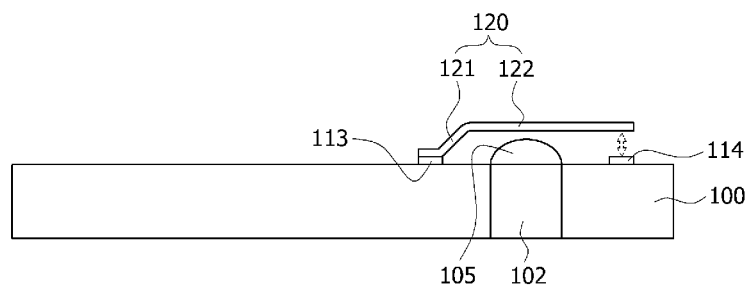
FIG. 14 is a cross-sectional view showing a semiconductor package in accordance with another embodiment of the present disclosure.

FIG. 14 is a cross-sectional view showing a semiconductor package in accordance with another embodiment of the present disclosure. Referring to FIG. 14, the semiconductor package in accordance with the present embodiment of the disclosure includes a semiconductor chip 100, a cantilever 120, and an electrified body 114. While at least one semiconductor chip is stacked on the semiconductor chip 100, this semiconductor chip is omitted for the sake of convenience in explanation. A through-silicon via 102 for chip selection is formed in the semiconductor chip 100, and a conductive protrusion 105 is formed on the upper surface of the through-silicon via 102. The cantilever 120 may be constituted by a first projection 121 and an extending part 122. The cantilever 120 may be supported by an anchor 113. The electrified body 114, which is placed below the distal end of the extending part 122, is used as a pull-down electrode. That is to say, if an electrical signal is applied to the cantilever 120 and the electrified body 114, the cantilever 120 is deformed toward the electrified body 114, and the extending part 122 of the cantilever 120 contacts the conductive protrusion 105, by which chip selection is implemented.

Since the conductive protrusion 105 serves as an electrical path, the conductive protrusion 105 may include a conductive substance such as a conductive polymer and a derivative thereof, a metal, a composite of a conductive polymer and a metal, etc. For example, the conductive protrusion 105 may include at least any one selected from a group consisting of conductive polymers containing olyaniline, polythiophene, poly(3,4-ethylene dioxythiophene), polypyrrole and PPV (polyphenylenevinylene), and derivatives thereof. Otherwise, the conductive protrusion 105 may include at least any one metal selected from a group consisting of gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chrome (Cr) and molybdenum (Mo). In a one example, the conductive protrusion 105 may be a solder bump. The solder bump may be formed through vacuum deposition, electroplating or screen printing. A UBM (under bump metallurgy) structure may be additionally provided under the solder bump. Electroplating may use a eutectic solder, and the UBM structure may use TiW. Screen printing is a method of forming a solder, such as Pb/In/Ag, Sn/Pb/In and Cu/Sb/Ag/An, through employing a stencil mask, and may use a lead-free solder of at least a ternary system and provides advantages in that a process is simple. In another example, the conductive protrusion 105 may use a gold bump, a gold stud bump, a nickel bump, etc. The gold bump may be formed through electroless plating or electroplating, and may use a UBM structure such as Cr/Cu—Cr/Cu/Au, TiW/Au and Ti/Au.

As is apparent from the above description, the semiconductor package and the method for selecting a chip in a semiconductor package according to the present disclosure may provide advantages in that, since chip selection is implemented in a mechanical switching type using cantilevers, redistribution layers and bonding wires are not needed, and signal delay does not occur, whereby it is possible to manufacture a package which is light, thin, compact and miniature.

The embodiments of the present disclosure are for illustrative purposes. Those skilled in the art will appreciate that various modifications, additions and substitutions are possible, without departing from the scope and spirit of the invention as disclosed in the accompanying claims.

What is claimed is:

1. A semiconductor package comprising:
   a first semiconductor chip formed with a first through-silicon via;
   a second semiconductor chip stacked over the first semiconductor chip and formed with a second through-silicon via;
   cantilever formed over the first semiconductor chip and electrically connected to the first through-silicon via or the second through-silicon via according to an electrical signal; and
   an electrified body formed over the first semiconductor chip at a position separated from the first through-silicon via to deform the cantilever.

2. The semiconductor package according to claim 1, wherein the cantilever comprises:
   a first projecting part projecting upward out of the first semiconductor chip at a position separated from the first through-silicon via; and
   an extending part extending horizontally from the first projecting part toward the second through-silicon via.

3. The semiconductor package according to claim 2, wherein the cantilever further comprises:

a second projecting part projecting from the extending part toward the second through-silicon via.

4. The semiconductor package according to claim 1, further comprising:
an anchor disposed under the cantilever to fasten the cantilever to the first semiconductor chip.

5. The semiconductor package according to claim 1, wherein the cantilever comprises a material selected from the group consisting of gold, silver, copper, aluminum, nickel, tungsten, titanium, platinum, palladium, tin, lead, zinc, indium, cadmium, chrome and molybdenum.

6. The semiconductor package according to claim 1, wherein the first semiconductor chip includes a chip selection wiring line to apply the electrical signal to the cantilever.

7. The semiconductor package according to claim 6, further comprising:
a switching element formed over the chip selection wiring line to control whether to deform the cantilever.

8. The semiconductor package according to claim 7, wherein the switching element comprises a transfer gate.

9. The semiconductor package according to claim 7, further comprising:
an inverter disposed on the chip selection wiring line.

10. The semiconductor package according to claim 1, further comprising:
a sealant sealing a perimeter of the cantilever.

11. The semiconductor package according to claim 10, wherein the sealant is selected from the group consisting of epoxy resin, phenol resin, acryl resin and isocyanate resin.

12. The semiconductor package according to claim 10, further comprising:
a filler that fills an area defined by the sealant.

13. The semiconductor package according to claim 12, wherein the filler comprises a liquid phase epoxy resin or a silicon oil.

14. The semiconductor package according to claim 1, further comprising:
a liquid dome coated on the cantilever.

15. The semiconductor package according to claim 14, wherein the liquid dome comprises a liquid phase epoxy resin or a silicon oil.

16. The semiconductor package according to claim 1, further comprising:
a molding member configured to mold the first semiconductor chip and the second semiconductor chip.

17. The semiconductor package according to claim 1, wherein the cantilever comprises an extending part which extends from the position separated from the first through-silicon via toward the first through-silicon via or the second through-silicon via, the first through-silicon via is placed below the extending part, and the semiconductor package further comprises an electrified body which is placed below an end of the extending part and is used as a pull-down electrode.

18. The semiconductor package according to claim 17, further comprising:
a conductive protrusion formed over the first through-silicon via.

* * * * *